(12) United States Patent
Benedict et al.

(10) Patent No.: US 11,658,080 B2
(45) Date of Patent: May 23, 2023

(54) METHODS AND SYSTEMS FOR TRANSPOSITION CHANNEL ROUTING

(71) Applicant: HEWLETT PACKARD ENTERPRISE DEVELOPMENT LP, Houston, TX (US)

(72) Inventors: Melvin K. Benedict, Houston, TX (US); Karl J. Bois, Ft. Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 289 days.

(21) Appl. No.: 17/084,375

(22) Filed: Oct. 29, 2020

(65) Prior Publication Data

US 2022/0139791 A1    May 5, 2022

(51) Int. Cl.
| H01L 21/66 | (2006.01) |
| H01L 21/768 | (2006.01) |
| G06F 30/392 | (2020.01) |
| G06F 30/394 | (2020.01) |

(52) U.S. Cl.
CPC ............ *H01L 22/32* (2013.01); *G06F 30/392* (2020.01); *G06F 30/394* (2020.01); *H01L 21/76885* (2013.01); *H01L 22/34* (2013.01)

(58) Field of Classification Search
CPC ... H01L 22/32; H01L 21/76885; H01L 22/34; G06F 30/392; G06F 30/394; G06F 2115/12; H05K 1/0228; H05K 1/0298; H05K 1/112; H05K 1/0245
See application file for complete search history.

(56) References Cited

U.S. PATENT DOCUMENTS

| 10,595,394 B1 * | 3/2020 | Kim ....................... H05K 1/113 |
| 2012/0161893 A1 * | 6/2012 | Ye ........................... H01P 3/08 333/5 |
| 2020/0303291 A1 * | 9/2020 | Perez-Corona ... H01L 23/49816 |

* cited by examiner

*Primary Examiner* — Nha T Nguyen
(74) *Attorney, Agent, or Firm* — Sheppard Mullin Richter & Hampton LLP

(57) ABSTRACT

Systems and assemblies are provided for transposition channel routing where the characteristics of an escape route can be modified on a printed circuit board (PCB) in a manner that reduces crosstalk and realizes significant signal quality improvement. The techniques involve "transposition" of a signal line pair on the PCB, reduces effect coupling coefficients for individual aggressor signals, thereby reducing the crosstalk. Transposition channel routing techniques can also be applied to other areas on a PCB (e.g., other than escape routes) where space is constrained and other mitigation techniques are not possible. The PCB can include an array of contact pads, a plurality of signal line pairs that include an escape route. One or more transposition junctions disposed within the escape route can route a signal line pair from a first routing channel in the escape route into a second routing channel in the escape route.

20 Claims, 4 Drawing Sheets

METHODS AND SYSTEMS FOR TRANSPOSITION CHANNEL ROUTING

DESCRIPTION OF RELATED ART

Escape routing generally refers to a pattern and method used to route the I/O pads or solder bumps on a die (or package) to the lines that can escape to the area surrounding the die to be routed out of the package or its immediate surroundings. Particularly with circuits that implement memory circuits that use double data rate (DDR) and quadruple data rate (QDR) standards, the integrated circuits (IC) chips often require high frequency data transmission links that provide low bit error rate (BER), high bandwidth and low on-chip latency.

Accordingly, escape routing techniques for printed circuit boards (PCBs) that implement memory circuits, must take into account such factors as: increased package size, increased channel bandwidth, smaller signal levels, and decreased via and pad spacing. This is in addition to factors that are frequently design considerations in conventional escape routing techniques, such as: ball pitch; land diameter; number of I/O pins; via type; pad size; trace width/spacing; and the number of layers required to escape the PCB.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Various embodiments described herein are directed to improved escape routing techniques for printed circuit boards (PCBs) implementing electronics that require high data rate channel buses, such as double data rate 5 (DDR5) memory modules. According to the embodiments, multiple physical characteristics of the escape route can be modified on the PCB in a manner that reduces crosstalk and realizes significant signal quality improvement. The improved escape routing techniques can involve adding interconnects, such as micro-vias, to the electrical trace layout that can be used for the "transposition" of the signal routing channels on the PCB. Transposing channels, as disclosed herein, effectuates a transposition of the relationship between two aggressor signals in a manner that reduces the effect coupling coefficients for individual aggressors. Accordingly, the disclosed transposition channel routing techniques can achieve reduced crosstalk by partially cancelling coupled signal lines in a channel, which otherwise may cause an unwanted transfer of signals between the channels on the PCB.

The various mechanisms and techniques of the disclosed embodiments may be referred to herein as transposition channel routing. As a general description of the techniques, one or more signal lines can be transposed, or repositioned, from a routing layer to another routing layer using micro-vias at designated transposition junctions along an escape route. The transposition of signal lines can add a second period to the via crosstalk term, reducing the peak accumulated via crosstalk by changing the phase relationship of the accumulated coupled signal. Additionally, a peak accumulated signal may be reduced by implementing the disclosed transposition channel routing techniques.

Furthermore, although the transposition channel routing techniques are described with respect to escape routing for purposes of discussion, it should be appreciated that the disclosed techniques can also be applied to areas on a PCB where space is constrained and other mitigation techniques are not possible. In other words, escape routing is one example of a practical application of the transposition channel routing techniques, as disclosed herein.

Figure 1A:
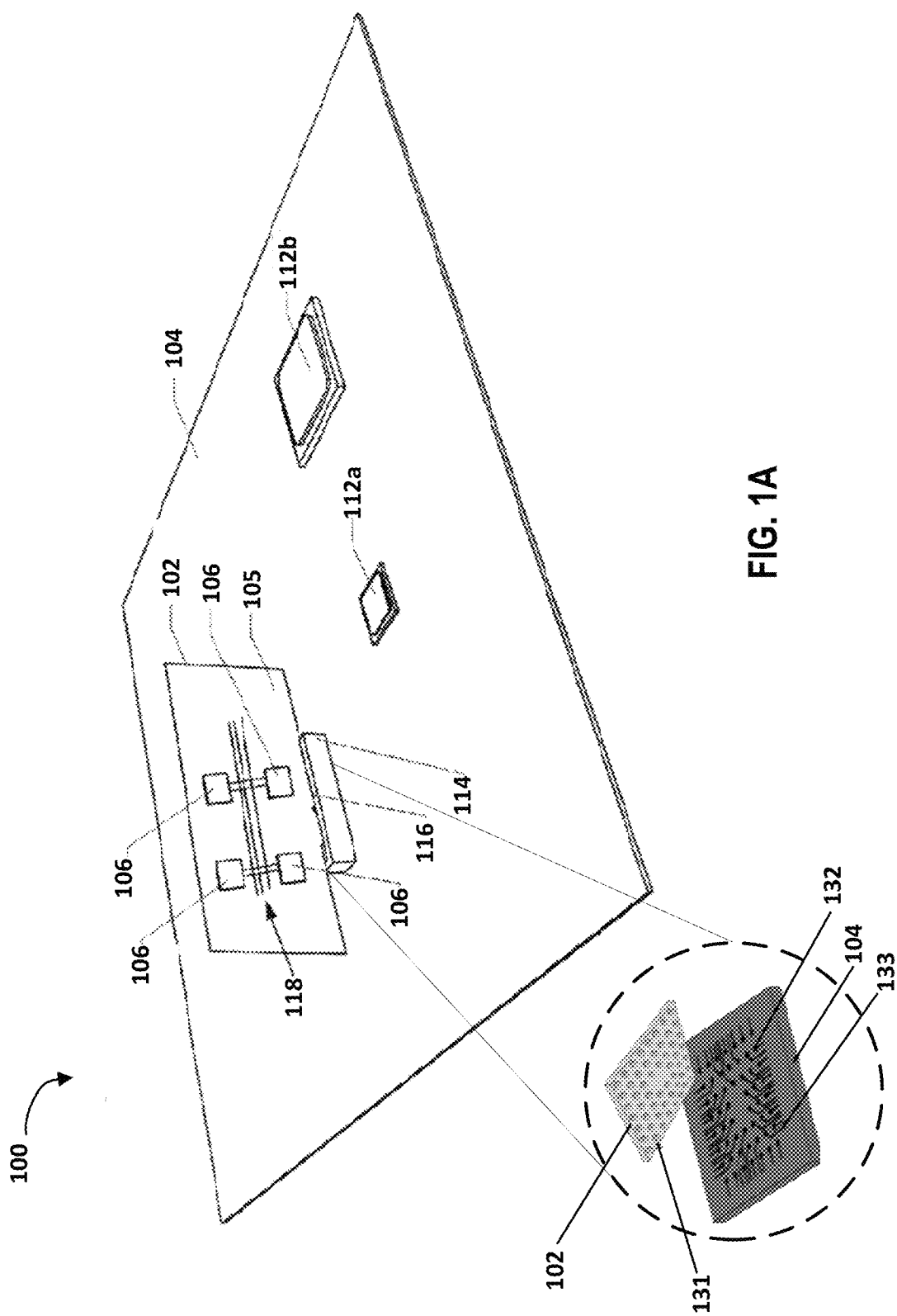
FIG. 1A is a diagram of a printed circuit board (PCB) that can implement the disclosed transposition channel routing techniques for improved escape routing, according to some embodiments.

FIG. 1A shows an example configuration for a PCB 104 where the disclosed transposition channel routing can be employed. As referred to herein, a PCB is a structure that mechanically supports and electrically connects electrical (or electronic) components using conductive tracks, pads and other features etched from sheet layers of conductive material (e.g., copper) laminated onto and/or between sheet layers of a non-conductive substrate. Although PCBs are discussed herein for purposes of illustration, it should be appreciated that the disclosed techniques can be applied to other types of electrical circuitry elements, such as printed circuit assemblies (PCAs), printed circuit board assemblies (PCBA5), circuit card assemblies (CCAs), and the like. In the example, the PCB 104 has circuitry to implement an electronic device 100 including a DDR5 memory modules 102. As background, electronic devices typically contain memory for storing data and software instructions. Such memory is typically provided between secondary storage (usually implemented with a disk-based storage device) and a central processing unit (CPU) of the electronic device. The memory can be implemented with dynamic random access memories (DRAMs). There are various different types of DRAMs, including synchronous DRAMs (SDRAMs) and double data rate (DDR) DRAMs (defined by standards set by JEDEC). The original DDR SDRAM standard has been superseded by later established standards, such as DDR5.

In the illustrated example, the PCB 104 can be configured to include high data rate channels, which are typically required for memory modules, such as a DDR5, to function optimally. For example, as a DDR5 memory, the memory module 120 can support data rates of approximately mega-transfers-per second (MT/s) with a fundamental frequency content of 2400-3200 mhz, thereby having increased performance and bandwidth. In order to accommodate such high data rate channels on the PCB 104, the disclosed transposition channel routing techniques can be used as a form of improved escape routing. Channels on the PCB 104 may be especially impacted by the particular escape routing that is employed, since as opposed to other signals, DDR5 channel buses are often required to be routed with minimal skew. For instance, escape routing on a PCB with high data rate channels, such as a PCB 104, may be impacted by multiple factors in the chips' design, including but not limited to:

1) increased package size, lengthening the channel escape routes from under the package;
2) increased channel bandwidth, lowering signal to noise ratio, increasing channel losses, and increasing lane to lane coupling; and
3) decreased via and pad spacing, moving traces closer together.

Also, FIG. 1A depicts that the PCB 104 can include multiple components 112a, 112b, also referred to herein as devices (e.g., processors, input/output controllers, memory controllers, bridge devices, etc.), that are mounted on a surface of the PCB 104. The PCB 104 can also include a connector 114 of the memory module 102. As shown, the memory module 102 is implemented as a dual in-line memory module (DIMM), which may be designed for use by PCs and servers. A DIMM is made up of a series of dynamic, random-access memory integrated circuits (ICs). These modules are mounted on the PCB 104 via the connector 114, which is illustrated as a DIMM connector (having an vertical orientation). One function of DIMM connector 114 is to stably hold the DIMMs once mounted, and route signals vertically between ICs (on the DIMM) and PCB 104. In some cases, the connector 114 may be connected to the PCB 104 via an interposer or packaged using a ball grid array (BGA).

As shown, the memory module 102 may be mounted in the connector 114, which includes a mechanical system such as a cavity in which an IC fits and a retention chip or a lever system for holding IC in place. Although the memory module 102 is described as a DDR5 memory module for purposes of illustration, it should be appreciated that the memory module 102 can be another type of memory module, such as a DDR SDRAM, DDR2, DDR3, DDR4, or a memory module having multiple DRAMs. Accordingly, transposition channel routing is applicable to various types of technologies having high data rate channels on circuit boards, such as a PCB. Memory channels, as disclose above, serve as an example of a specific technology which benefits from the disclosed techniques.

The memory module 102 can include memory devices 106 that are mounted to a first surface 105 of the memory module 102. The memory module 102 further has an opposite surface (on the other side of the memory module 102 that is not visible in the view of FIG. 1A) on which additional memory devices can be mounted. The memory devices 106 can include packaging, e.g., flip-chip packaging, that provides an array of pins (or terminals) for electrical connections. Data input into a memory device 106 is stored in memory cells of that memory device 106. In one example, the memory devices 106 can have a ×4 data pin configuration (in which four data pins are used). The data pins of the memory devices 106 are interconnected by conductive lines 108 on the memory module 102. The conductive lines 108 can be implemented as conductive traces on the memory module 102.

As alluded to above, the DDR5 may require the PCB 104 to have high density electrical traces around the connector 114 for the IC implementing the memory module 102. As an example, some of the traces in the PCB 104 may need to route signals that exit on one side of the component 112b (shown as an IC chip) to connect to the connector 114 (shown on the opposite side of the PCB 104). Thus, the PCB 104 may need many layers to route traces that cross under the IC of the component 112b and the connector 114. As an example, the component 112b can be implemented as an IC chip device (e.g., CPU) having an ASIC with an associated chip substrate. Under the ASIC for the component 112b may be a socket. The combination of the packaged chip and potential socket for the device 112b, can then be assembled to the PCB 104. A close-up (indicated by dashed circle) illustrating a mounting side of the ASIC (or IC chip) implementing the component 112b is shown.

As seen in the close-up section of FIG. 1A, the component 112b can be a surface-mount package with one side (e.g., mounting side) of the package having an array of pads 131 (I/O contacts) on its bottom surface, where each pad has a solder ball attached thereto. Bottom pads 131 (e.g., on the BGA) can be arranged in a pattern matching the pattern of pads 132 on the PCB 104. The pattern of bottom pads 131 may match the pattern of top pads 132 on the PCB 104, such that the bottom pads 131 of the packaging are directly connected to corresponding top pads 132 of the PCB 104 by vertical conductive vias. In some cases, the pattern of bottom pads 131 may include a scaling to a larger pitch or contact size than used for pads 132 on the PCB 104, or may be different from the pattern of pads 132. In particular, top pads 132 of the PCB 104 that are adjacent to each other may respectively be connected to bottom pads 131 on the that are adjacent, thereby causing their respective connecting vias to also be adjacent. The array of pads 131 (or contacts) make electrical connections to respective pads in an array on PCB 104, and a conductive network of vias, traces, or other electrical routings that connect top contacts to bottom contacts. In this example, transposition channel routing can be implemented using a pattern of signal lines beneath the component 112b routed out of its immediate surroundings, in adjacent layers between the connector 114 and the component 112b on the PCB 104.

The routes on the PCB 104 can start under component 112b for the disclosed techniques. The routes may propagate to the connector 114 connecting the memory module 102 (i.e., DIMM). That is, the transposition channel routing techniques disclosed herein can be applied to routes that flow from device 112b to the connector 114 of the memory module 102 (i.e., DIMM), and it is in that region of the PCB 104 where the transposition channel routing occurs.

As alluded to above, routing of signals from beneath the device 112b can provide routings to the ICs of the memory module 102, and to devices 112a on the other side of the PCB 104. For example, signal lines 133 routed in between an IC package (or socket) layer and a PCB 104 can escape outside the footprint of the IC chip packaging (or outside the main chip cavity) for the component 112b. As will be described in further detail, the signal lines 133 on the PCB 104 may be arranged as multiple pairs of signal lines (e.g., two signal lines running parallel to each other) that are particularly routed to travel the same channel (either above or below) around adjacent pads 132 in a layer, as an escape route. The transposition routing techniques can involve physically transposing the signal lines 133, namely repositioning the signal lines 133 from a routing channel (e.g., running in a layer below a pad) to a transposition channel (e.g., interconnected to the routing channel using microvias) for, at least, a partial length of the escape route. Details of transposition signal routing are shown and described in reference to FIG. 3. As referred to herein, a transposition channel can be a routing channel that is particularly used for directing the electrical traces that have been "transposed" to a different routing channel from their initial routing channel in the escape route.

Furthermore, the component 112b, being an IC that is socket-mounted on the PCB 104, can communicate to other devices (e.g., component 112a) through electrically conductive traces formed in and on the PCB 104. With respect to routing, the area of the PCB 104 under the component 112b and the connector 114 for memory module 102 may provide space for traces or routings that may extend beyond the boundaries of their respective ICs. Accordingly, the transposition channel routing techniques can be implemented in spaces of the PCB 104 having electrical traces connecting the component 112b to other devices.

Figure 1B:
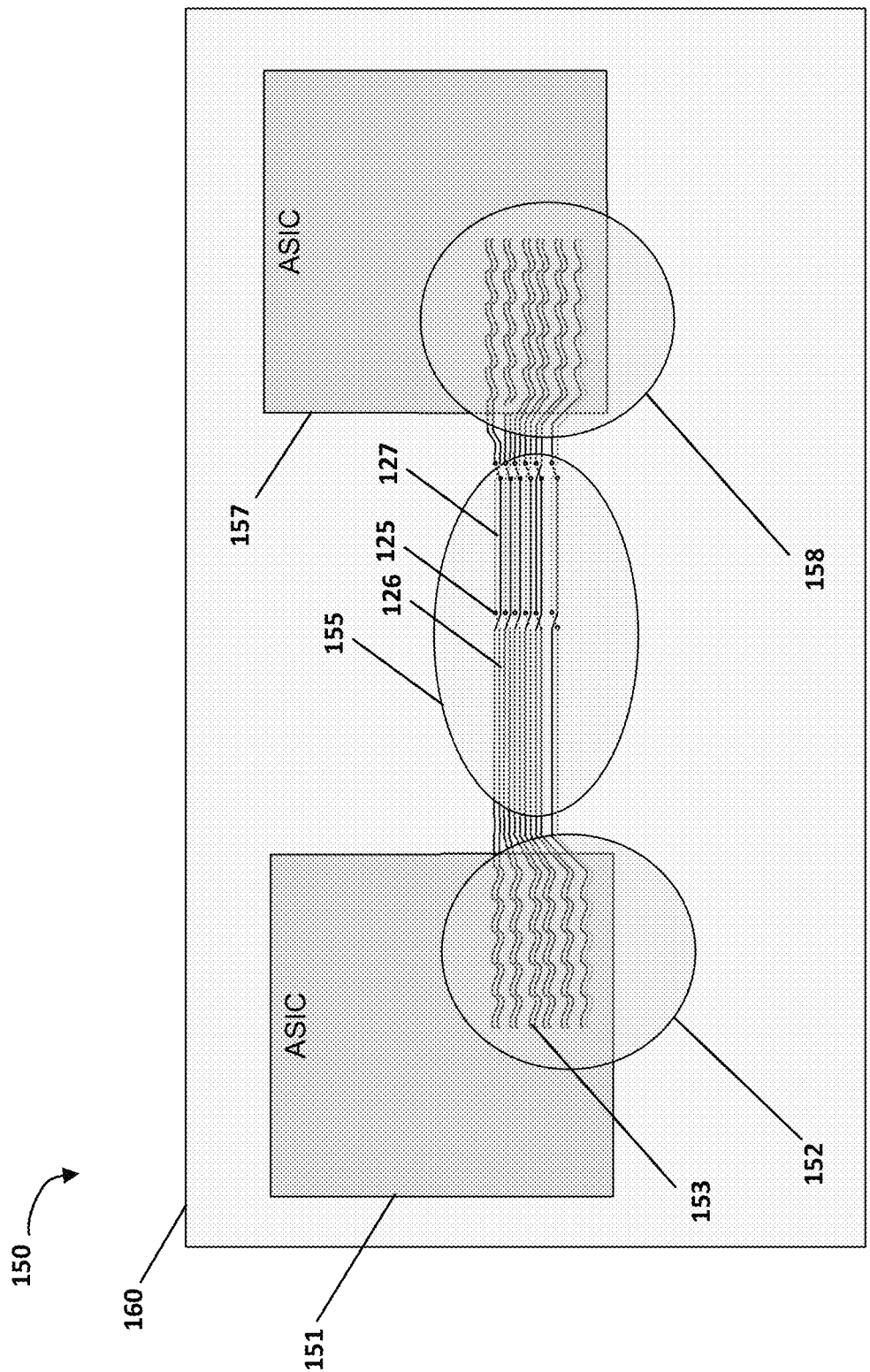
FIG. 1B is a diagram of an application specific integrated circuit (ASIC) to ASIC architecture that can implement the disclosed transposition channel routing techniques, according to some embodiments.

FIG. 1B depicts an example of another circuitry configuration 150, shown as ASIC 151 to ASIC 157, in which the disclosed transposition routing techniques can be implemented. Particularly, FIG. 1B shows that the transposition signal routing techniques can be implemented in a constrained open field section of the PCB (as opposed to an escape route from beneath a socket, IC chip, and the like as shown in FIG. 1A). In the illustrated example of FIG. 1B, a first ASIC 151 and a second ASIC 157 are shown to be disposed on distal ends of a circuit substrate, shown as PCB 160. Further, close-up views illustrate the multiple electrical traces, or signal lines 153, that can be routed from the areas on the PCB 160 where the ASICs 151, 157 are mounted. Specifically, the signal lines 153 are routed as traces that connect ASIC 151 on one side of the PCB 160 to ASIC 157 on the opposing end of the PCB 160. Also, shown is a constrained open field 155 section of the PCB 160. As shown, the constrained open field 155 is a section of open space on the PCB 160 in between the ASICs 151, 157. The signal lines 153 are routed through the constrained open field 155 such that that form traces which connect the ASICs 151, 157 on the board. For example, the signal lines 153 can be described as running from the ASIC 151 (on the left) through the constrained open field 155 and terminating at the ASIC 157 (on the right), or vice versa.

In this configuration, the disclosed transposition channel routing techniques can be implemented within the constrained open field 155. As will be described in further detail, the signal lines 153 on the PCB 160 may be arranged as multiple pairs of signal lines (e.g., two signal lines running parallel to each other) as they traverse the constrained open field 155. Consequently, applying transposition channel routing to the signal lines 153 approximately for the length of the traces through the constrained open field 155 can transpose the pairs of signal lines 153 from a routing channel 126 to a transposition channel 127. As shown, multiple micro-vias 125 can be used as interconnections for "transposing" the signal lines 153 from their respective routing channel 126 to a transposition channel 127 (which may be on a different layer of the PCB 160 than the routing channel 126). This transposition of the signal lines 153 also transposes the relationship between the two aggressor signals to partially cancel the coupled signals of the signal line pair, and reduces crosstalk. Additionally, transposition routing of signal lines 153 in the constrain open field 155 area can change the phase relationship of the accumulated coupled signal (from interaction of the signal line pairs) on the signal lines 153 up to that point (e.g., start of transposition at the transposition junction).

Figure 2:
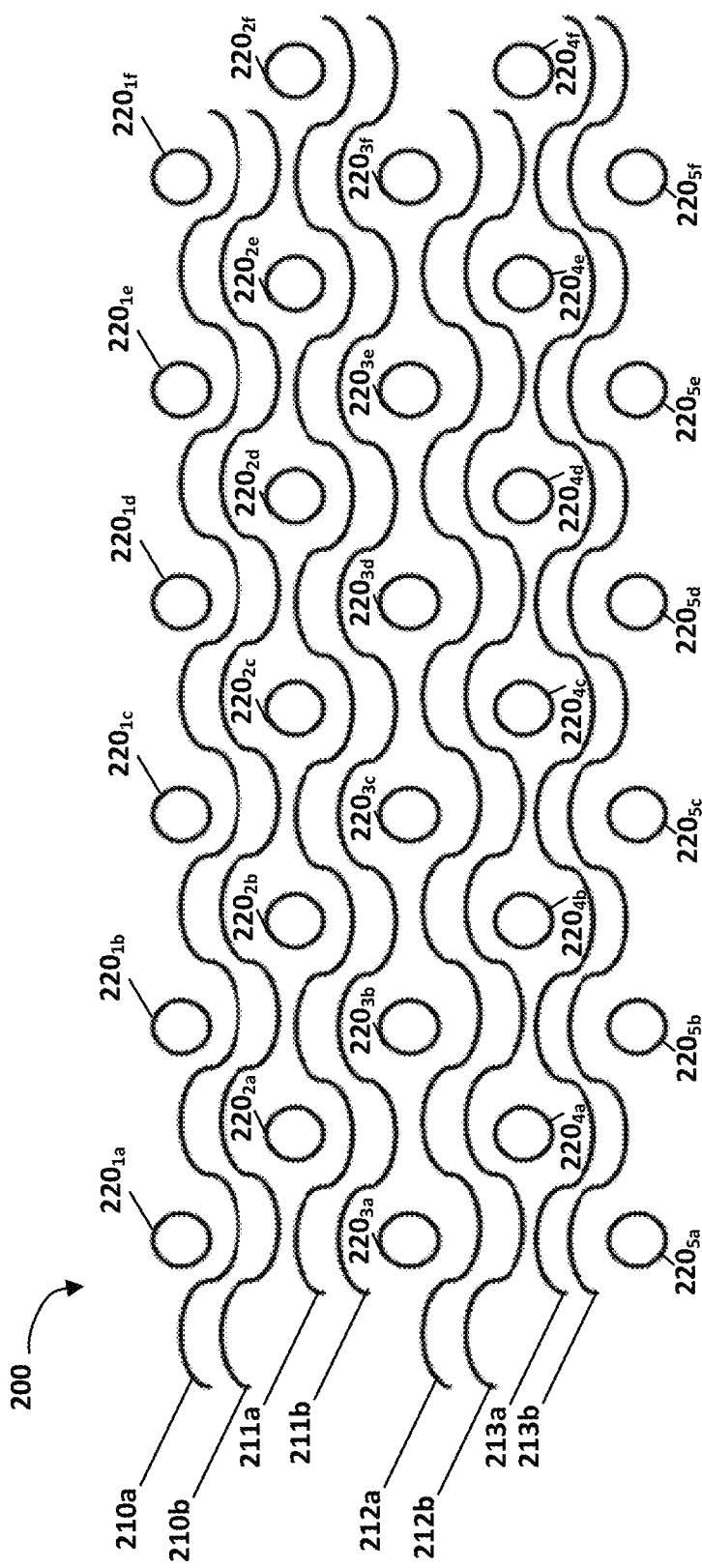
FIG. 2 is an example of a conventional escape routing pattern.

FIG. 2 depicts a portion of a typical escape routing pattern 200 that can be arranged on a substrate, such as a PCB (shown in FIG. 1A). The vertical columns of the pattern 200 can represent "layers" of semi-conductive components mounted on the PCB (e.g., BGA, sockets, ICs, etc.), and the horizontal can represent "rows" that run along the horizontal plane of the PCB, which is also referred to herein as the "length" of the escape routing pattern 200. Also shown, is an array of various contact points $220_{1a}$-$220_{5f}$, which represent a pattern of solder balls, vias, or conductive pads, on the corresponding IC packaging or substrate. In some cases, the array of contact points $220_{1a}$-$220_{5f}$ is configured to match (in number and shape) the corresponding pattern of pads (or balls) on the IC package to which it will be mounted.

As can be seen, signal lines 210a-213b (also referred to as "metal traces" or "trace") exit from the periphery contacts $220_{1a}$, $220_{2a}$, $220_{3a}$, $220_{4a}$, and $220_{5a}$ (on the right side) and contacts $220_{1f}$, $220_{2f}$, $220_{3f}$, $220_{4f}$, and $220_{5f}$ (on the left side) that are adjacent the outer edges of the escape routing pattern 200. More particular, the signal lines 210a-213b are arranged into pairs at each layer of the pattern 200. Further, these pairs of signal lines run parallel to each other, traversing the same route across the full length of the escape routing pattern 200. For instance, in the illustrated example, signal lines 210a, 210b are positioned parallel to each other (with signal line 210a directly above signal line 210b), being routed horizontally along the first row (or layer) of the pattern 200, between contacts $220_{1a}$, $220_{1b}$, $220_{1c}$, $220_{1d}$, $220_{1e}$, and $220_{1f}$ and $220_{2a}$, $220_{2b}$, $220_{2c}$, $220_{2d}$, $220_{2e}$, and $220_{2f}$. Restated, signal lines 210a, 210b traverse the same path for the entire length of the escape route routing pattern 200, running in parallel with each other in a routing channel beneath contacts $220_{1a}$, $220_{1b}$, $220_{1c}$, $220_{1d}$, $220_{1e}$, and $220_{1f}$ and above the contacts $220_{2a}$, $220_{2b}$, $220_{2c}$, $220_{2d}$, $220_{2e}$, and $220_{2f}$. Also, a pitch (i.e., distance between centers of pads) is the same in both the horizontal and vertical directions, though this need not be the case. In some cases, the number of traces that can exit through a layer depth (n=1) is limited by the pitch, the pad dimension, and the trace width. Thus, in some embodiments, there may be more than two signal lines that are run in parallel through each layer (or row) in the pattern 200.

With the pairs of signal lines 210a, 210b; 211a, 211b; 212a, 212b; and 213a, 213b being routed together (in parallel) through a routing channel (or row), there is some coupling between the signal lines in each of the pairs. Generally, as the length (e.g., distance and/or time) of coupling between the signal line pairs 210a, 210b; 211a, 211b; 212a, 212b; and 213a, 213b increases, the amount of interference between the signals similarly increases. Consequently, a substantially large amount of interference, or crosstalk, may be accumulated on the signal lines, due to the signal line pairs 210a, 210b; 211a, 211b; 212a, 212b; and 213a, 213b being coupled together for the full length of the escape route in this pattern 200. Also, this pattern 200 for escape routing can cause a large coupled signal amplitude to be accumulated on the routing channels, which can degrade quality of the signal (e.g., low signal to noise ratio, increased channel losses). Accordingly, conventional escape routing techniques, as shown in FIG. 2, are particularly non-optimal for circuitry requiring high data rate channels to be implemented on the PCBs, such as the DDR5 memory circuitry (shown in FIG. 1A).

To achieve escape routing, it is common for the outer rows (for example, two to four of the outer rows) within the array to contain all pins that require escape routing. The number of metal traces on the PCB that can be routed between adjacent contacts is limited, however, by the width of the traces, the size (e.g., diameter) of the contacts, and the design rules associated therewith. Thus, as the interconnect complexity of modern PCBs (and IC packages) increases, it has become increasingly difficult to route traces from the internal contacts of the array while still achieving suitable design tolerances for number of traces that can reasonably fit between adjacent contacts. As the number of pins in ICs increases, the number of rows and layers required for escape routing increases non-linearly. Even further, complex IC designs can cause many IC package sizes to increase, lengthening the channel escape routes from under the package. These aforementioned challenges can be intensified by the implementation of high data rate channels on PCBs, particularly in DDR technology. Accordingly, the disclosed transposition channel routing techniques can realize an improvement over conventional escape routing techniques, such as pattern 200, by transposing (or repositioning) signal lines from one routing channel to another routing channel, for example a transposition channel. Therefore, the disclosed transposition can cancel out the accumulation of the couple signal line pairs along some portion(s) of the escape route length (e.g., reducing the length of coupling of signal lines along any given routing channel).

Figure 3:
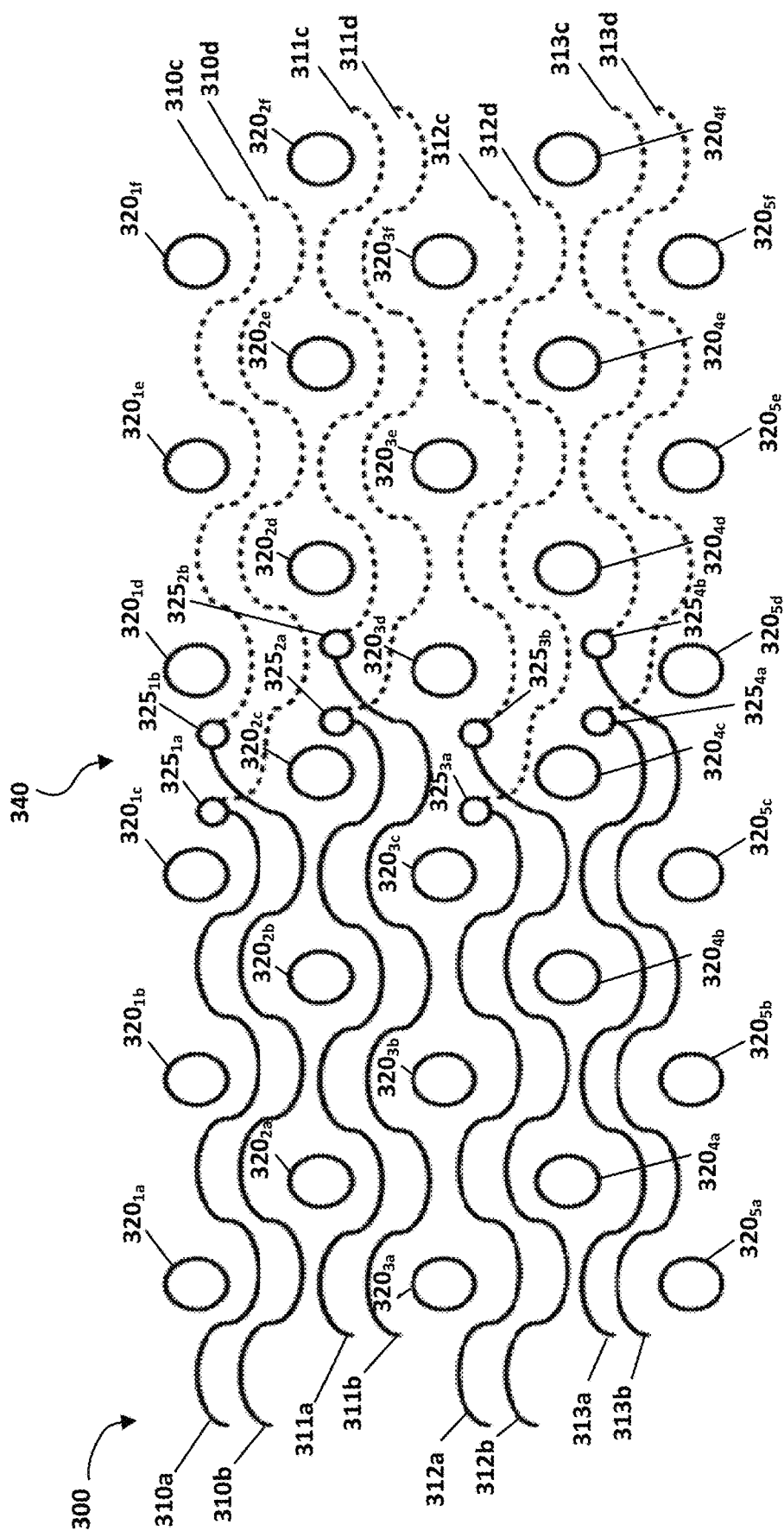
FIG. 3 is an example of an improved escape routing pattern that can be implemented in the PCB of FIG. 1A including an example of a transposition channel routing technique, according to some embodiments.

FIG. 3 depicts a portion of an escape routing pattern 300 that can be arranged on a substrate, such as a PCB (shown in FIG. 1A), implementing the disclosed transposition channel routing techniques. As an example, the PCB can include a plurality of component interface fields, which comprises the plurality of component contact pads $320_{1a}$-$320_{5f}$. For purposes of discussion, the contacts $320_{1a}$-$320_{5f}$ are described as contact pads, but it should be appreciated that contacts can also be vias, or other interconnections that may correspond to the contacts pads $320_{1a}$-$320_{5f}$. For example, a corresponding via may be placed at the same positions of each of the contact pads $320_{1a}$-$320_{5f}$.

The plurality of signal lines that includes 310a, 310b; 311a, 311b; 312a, 312b; and 313a, 313b can be disposed on the PCB, having a first end that is connected to one of the contact pads $320_{1a}$-$320_{5f}$ and a second end connected to a system interface bus of the PCB. In designing an electrical trace layout for the PCB including the escape routing pattern 300 comprising the plurality of signal lines and the one or more transposition junctions for each of the signal line pairs.

Similar to FIG. 2, contacts $320_{1a}$-$320_{5f}$ (also referred to as contact pads) represent a pattern of solder balls, or conductive pads, on the corresponding IC packaging or substrate. Also, signal lines 310a-313b exit from the periphery contacts $320_{1a}$, $320_{2a}$, $320_{3a}$, $320_{4a}$, and $320_{5a}$ (on the right side) and contacts $320_{1l}$, $320_{2k}$, $320_{3l}$, $320_{4k}$, and $320_{5l}$ (on the left side) that are adjacent the outer edges of the escape routing pattern 300. Also, the pairs of signal lines 310a, 310b; 311a, 311b; 312a, 312b; and 313a, 313b are routed together (in parallel) through a specific routing channel (or row). For instance, signal line pair 310a, 310b run in parallel in a routing channel around contacts $320_{1a}$, $320_{1m}$, $320_{1c}$ for a portion of the escape route. Thus, there is some coupling between the signal lines in each of the pairs for this duration. However, in contrast to the escape route in FIG. 2, transposition channel routing is applied to the signal line pairs, thereby rerouting the signal lines pairs to continue to run in parallel (e.g., coupled) with each other in another channel, shown as transposition channel, of the escape routing pattern 300. That is, in the illustrated example, both signal lines of the pair can be "transposed" from their initial routing channel and ran though a different routing channel. As shown, the "transposed" signal lines 310c, 310d; 311c, 311d; 312c, 312d; and 313c, 313d (represented by dashed lines) are on the left of the transposition junction 340. The "transposed" signal lines 310c, 310d; 311c, 311d; 312c, 312d; and 313c, 313d are signal lines that have been re-directed through micro-vias $325_{1a}$, $325_{1b}$; $325_{2a}$, $325_{2b}$; $325_{3a}$, $325_{3b}$; and $325_{4a}$, $325_{4b}$ from an initial routing channel to a transposition channel, adding a second period to the via crosstalk term that may cancel any accumulation on coupled signal line pairs. It should be understood that the transposition channel can be considered as being in a separate and adjacent layer of the PCB with respect to the initial routing channel. For example, the micro-vias $325_{1a}$, $325_{1b}$; $325_{2a}$, $325_{2b}$; $325_{3a}$, $325_{3b}$; and $325_{4a}$, $325_{4b}$ can be blind and/or buried vias on the PCB that consists of pads in an additional routing layer in the electrical trace layout, namely the transposition channel. The micro-vias $325_{1a}$, $325_{1b}$; $325_{2a}$, $325_{2b}$; $325_{3a}$, $325_{3b}$; and $325_{4a}$, $325_{4b}$ can correspond to positions (in the layer for the transposition channel of the PCB), that are electrically connected by a hole through the board to a corresponding contact pad (in the layer for the initial routing channel). As referred to herein, micro-vias can be vias having a small diameter (approximately equal to or less than 150 microns) in comparison to mechanically drilled vias.

In FIG. 3, pairs of micro-vias $325_{1a}$, $325_{1b}$; $325_{2a}$, $325_{2b}$; $325_{3a}$, $325_{3b}$; and $325_{4a}$, $325_{4b}$ are placed at a transposition junction 340 (point along the length of the escape route 300), such that each pair of micro-vias $325_{1a}$, $325_{1b}$; $325_{2a}$, $325_{2b}$; $325_{3a}$, $325_{3b}$; and $325_{4a}$, $325_{4b}$ corresponds to a respect signal line pair 310a, 310b; 311a, 311b; 312a, 312b; and 313a, 313b. In the illustrated example: signal line pair 310a, 310b is re-routed through micro-via pair 3251a, 3251b in order to directed the "transposed" signal lines 310c, 310d through the transposition channel adjacent to contact pads $230_{1d}$, $320_{1e}$; $320_{1f}$; signal line pair 311a, 311b is re-routed through micro-via pair $325_{1a}$, $325_{1b}$ in order to directed the "transposed" signal lines 311c, 311d through the transposition channel adjacent to contact pads $230_{2d}$, $320_{2e}$; $320_{2f}$; signal line pair 312a, 312b is re-routed through micro-via pair $325_{3a}$, $325_{3b}$ in order to directed the "transposed" signal lines 312c, 312d through the transposition channel adjacent to contact pads $230_{3d}$, $320_{3e}$; $320_{3f}$; and signal line pair 313a, 313b is re-routed through micro-via pair $325_{4a}$, $325_{4b}$ in order to directed the "transposed" signal lines 313c, 313d through the transposition channel adjacent to contact pads $230_{4d}$, $320_{4e}$; $320_{4f}$.

By implementing this transposition channel (adding micro-vias $325_{1a}$, $325_{1b}$; $325_{2a}$, $325_{2b}$; $325_{3a}$, $325_{3b}$; and $325_{4a}$, $325_{4b}$), the transposition of the signal lines changes the relationship position as the lines are routed parallel to each other. For a period of time when the relationship between two aggressor signals are transposed, it can induce additional noise in the opposite phase (e.g., in the opposite direction), which results in a cancelling out of any interference that may be accumulated as the coupled signal pairs traverse the initial routing channels. Restated, transposing the relationship of the signals from one layer to another, can add a cancelation factor to the interference of the two signals. This also reduces the coupling length for individual aggressors, which reduces the crosstalk and limits the frequency content of the coupled signals. As alluded to above, position 340 in the escape route length can represent a "transposition junction" in the escape routing pattern 300, which can be described as a point of offset (or transposition) of the "transposed" signal lines to a different routing channel, namely the transposition channel.

Although not shown in FIG. 3, various combinations of signal lines can be "transposed" in the same manner described above, as deemed necessary or appropriate. For example, only one signal line of the signal line pair may be transposed. As another example, one or more signal line pairs (lesser than all of the signal lines pairs in the electrical trace layout) may be transposed. In yet another example, there escape route pattern may include more than one transposition junction. In yet another example, signal line pairs may be "transposed" for a smaller portion of the escape route length (e.g., shorter distance between transposition junctions), thereby allowing the frequency of the transposition to be increased. In other words, the same signal lines pair may be transposed two or more times along the length of the escape route pattern 300. Accordingly, in some embodiments of the transposition channel routing techniques the placement of the transposition junctions in the escape route, which sets the spacing between offsets (or transitions) of the transposed signal lines can be varied based on the specific application or a desired amount of crosstalk reduction. As a general concept, it should be understood that shortening the spacing between "transposed" positions of the signal lines, in turn increases the coupling reduction. For example, a total number of transposed junctions to be used within an electrical trace layout can be determined, and variably adjusted as a design choice prior to fabricating the PCB. The total number of transposition junctions in the electrical trace layout (e.g., escape route portion of the PCB) can govern a length of coupling between the signal lines within a respective signal line pair. That is, at each transposition junction, the signal line pair is transposed by to an adjacent channel. Generally, the total number of transposition junctions has an inversely proportional relationship to a length of coupling of a signal line pair in a respective routing channel. For instance, increasing the total number of transposition junctions in an escape route, adding multiple periods to the via crosstalk term, which may increase the reduction of the peak accumulated via crosstalk.

Implementing the disclosed transposition channel routing techniques, shown in the escape routing pattern 300, can result in an estimated reduction coupling by 50% for the same Nyqyist frequency. It should be understood that due to the use of re-routed, or "transposed" routing channels, the disclosed techniques may require an occasional added routing channel (e.g., 1 added routing channel per 16 lanes on a given layer). Nonetheless, the resulting improved signal to noise ratio, increases the reliability and information carrying capacity of the channel, which are both important characteristics in platforms developed to high performance/high data rate applications, such as a Service (AaS) applications and DDR5.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A device comprising:
   a printed circuit board (PCB) comprising an array of contact pads;
   a plurality of signal lines disposed on the PCB, wherein a portion of the plurality of signal lines comprise an escape route on the PCB;
   a plurality of routing channels, wherein each routing channel is positioned between a first row of contact pads and a second row of contact pads, wherein each routing channel comprises a first channel on a first PCB layer and a second transposition channel on a second PCB layer, and wherein a pair of signal lines are routed in the routing channel; and
   one or more transposition junctions disposed within the escape route, wherein a respective transposition junction comprises a plurality of pairs of vias respectively positioned in the plurality of routing channels, and wherein a respective pair of vias are configured to connect the first channel on the first PCB layer to the corresponding second transposition channel on the second PCB layer in such a way that the corresponding pair of signal lines are routed from the first PCB layer to the second PCB layer with their relative positions switched, thereby reducing crosstalk between the corresponding pair of signal lines.

2. The device of claim 1, wherein the first channel is on the same PCB layer of the array of contact pads.

3. The device of claim 1, wherein the second transposition channel and the array of contact pads are on separate and adjacent layers.

4. The device of claim 1, wherein the pair of vias are configured to route the corresponding pair of signal lines from the first PCB layer to the second PCB layer such that a signal relationship between two aggressor signals is transposed.

5. The device of claim 1, wherein the second routing transposition channel is adjacent to the first channel, and a first signal interference is accumulated corresponding to a coupling of the signal line pair traversing the first channel.

6. The device of claim 5, wherein the first layer of the PCB is adjacent to the second layer of the PCB, and a second signal interference is accumulated in the second transposition channel corresponding to a coupling of the signal line pair traversing the second transposition channel.

7. The device of claim 6, wherein the second signal interference accumulated in the second transposition channel is generated in an opposite phase of the first signal interference accumulated in the first channel.

8. The device of claim 7, wherein the second interference accumulated in the second transposition channel cancels out the first signal interference accumulated in the first channel.

9. The device of claim 1, wherein the signal line pair is routed in the second transposition channel from the transposition junction for a remaining length of the escape route.

10. The device of claim 1, wherein the signal line pair is routed in the second transposition channel from the transposition junction for the length of the escape route to a second transposition junction.

11. The device of claim 1, wherein transposing the signal line pair from the first channel to the second transposition channel for the length of the escape route introduces a second period to a via crosstalk term.

12. The device of claim 1, wherein a total number of the one or more transposition junctions disposed within the escape route is variable and adjusts the length of the escape route corresponding to routing the signal line pair in the second transposition channel.

13. The device of claim 1, wherein the plurality of pairs of signal lines comprise high data rate signal lines.

14. The device of claim 1, wherein the PCB comprises an integrated circuit (IC) implementing a second device comprising high data rate channel buses.

15. The device of claim 14, wherein the second device comprises a double data rate (DDR) memory module.

16. A printed circuit board (PCB), comprising:
an array of contact pads;
a plurality of signal lines disposed on the PCB, wherein a portion of the plurality of signal lines traverse a constrained open field on the PCB;
the plurality of signal lines configured into a plurality of routing channels with each routing channel comprising a pair of signal lines, wherein each routing channel comprises a first channel on a first PCB layer and a second transposition channel on a second PCB layer; and
one or more transposition junctions disposed within the constrained open field on the PCB, wherein a respective transposition junction comprises a plurality of pairs of vias respectively positioned in the plurality of routing channels, and wherein a respective pair of vias are configured to connect the first channel on the first PCB layer to the corresponding second transposition channel on the second PCB layer in such a way that the corresponding pair of signal lines are routed from the first PCB layer to the second PCB layer with their relative positions switched, thereby reducing crosstalk between the corresponding pair of signal lines.

17. The PCB of claim 16, wherein the pair of vias are configured to route the corresponding pair of signal lines from the first PCB layer to an adjacent PCB layer such that a signal relationship between two aggressor signals is transposed.

18. A method, comprising:
determining a plurality of routing channels, wherein each routing channel comprises a first channel on a first PCB layer and a second transposition channel on a second PCB layer, and wherein a pair of signal lines are routed in the routing channel;
determining one or more transposition junctions disposed along the plurality of routing channels, wherein a respective transposition junction comprises a plurality of pairs of vias respectively positioned in the plurality of routing channels, and wherein a respective pair of vias are configured to connect the first channel on the first PCB layer to the corresponding second transposition channel on the second PCB layer in such a way that the corresponding pair of signal lines are routed from the first PCB layer to the second PCB layer with their relative positions switched;
designing an electrical trace layout for a printed circuit board (PCB) including a pattern comprising the plurality of routing channels and the one or more transposition junctions for each routing channel; and
manufacturing the PCB based on the electrical trace layout.

19. The method of claim 18, wherein determining the one or more transposition junctions comprises determining a total number of the one or more transposition junctions within the electrical trace layout.

20. The method of claim 19, wherein the pair of vias are configured to route the corresponding pair of signal lines from the first PCB layer to an adjacent PCB layer such that a signal relationship between two aggressor signals is transposed.

* * * * *